(12) United States Patent
Cho et al.

(10) Patent No.: US 9,595,543 B2
(45) Date of Patent: Mar. 14, 2017

(54) ARRAY SUBSTRATE FOR LIQUID CRYSTAL DISPLAY DEVICES AND METHOD OF MANUFACTURING THE SAME

(71) Applicant: LG Display Co., Ltd., Seoul (KR)

(72) Inventors: SungJun Cho, Gyeonggi-do (KR); YoungMin Jeong, Gyeonggi-do (KR); KyeuSang Yoon, Gyeonggi-do (KR); YeonHee Jang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/163,303

(22) Filed: May 24, 2016

(65) Prior Publication Data

US 2016/0268308 A1    Sep. 15, 2016

Related U.S. Application Data

(62) Division of application No. 14/538,987, filed on Nov. 12, 2014, now Pat. No. 9,379,140.

(30) Foreign Application Priority Data

Nov. 12, 2013    (KR) ........................ 10-2013-0137132

(51) Int. Cl.
| | |
|---|---|
| H01L 27/12 | (2006.01) |
| G02F 1/1362 | (2006.01) |
| G02F 1/1343 | (2006.01) |
| G02F 1/133 | (2006.01) |
| G02F 1/1333 | (2006.01) |
| G02F 1/1368 | (2006.01) |
| H01L 29/786 | (2006.01) |

(52) U.S. Cl.
CPC .......... *H01L 27/124* (2013.01); *G02F 1/1368* (2013.01); *G02F 1/13306* (2013.01); *G02F 1/13439* (2013.01); *G02F 1/133345* (2013.01); *G02F 1/134309* (2013.01); *G02F 1/134363* (2013.01); *G02F 1/136213* (2013.01); *G02F 1/136286* (2013.01); *H01L 27/127* (2013.01); *H01L 27/1222* (2013.01); *H01L 27/1255* (2013.01); *H01L 27/1259* (2013.01); *H01L 29/78669* (2013.01); *G02F 2001/134372* (2013.01); *G02F 2001/136295* (2013.01)

(58) Field of Classification Search
CPC ..................................................... H01L 27/127
See application file for complete search history.

(56) References Cited

U.S. PATENT DOCUMENTS 9,081,244 B2 *   7/2015   Hong ................ G02F 1/136209
2014/0125908 A1   5/2014   Hong et al.

* cited by examiner

*Primary Examiner* — Thanhha Pham
(74) *Attorney, Agent, or Firm* — Morgan, Lewis & Bockius LLP

(57) ABSTRACT

An array substrate for LCD devices and a method of manufacturing the same are provided. By using a structure where an empty space is secured in a data line area as in a DRD structure in which the number of data lines is reduced by half, a capacitance is sufficiently secured by forming a sub storage capacitor in the data line area of the empty space, and thus, an area of a main storage capacitor can be reduced. Accordingly, the cost can be reduced, and moreover, an aperture ratio can be enhanced.

9 Claims, 15 Drawing Sheets

ARRAY SUBSTRATE FOR LIQUID CRYSTAL DISPLAY DEVICES AND METHOD OF MANUFACTURING THE SAME

CROSS-REFERENCE TO RELATED APPLICATION

This application is a divisional application of co-pending U.S. application Ser. No. 14/538,987, filed in the United States on Nov. 12, 2014, and claims the benefit of earlier filing date and right of priority to Korean Application No. 10-2013-0137132, filed on Nov. 12, 2013, the contents of which are incorporated by reference in their entirety.

BACKGROUND OF THE DISCLOSURE

Field of the Disclosure

The present disclosure relates to an array substrate for liquid crystal display (LCD) devices and method of manufacturing the same.

Background of the Disclosure

Recently, as society advances to the information-oriented society, the display field of processing and displaying a massive amount of information is rapidly advancing. In particular, thin film transistor (TFT) LCD devices, which have excellent performance in terms of thinning, lightening, and low power consumption, have been developed and are replacing the existing cathode ray tube (CRT).

In particular, active matrix LCD devices which use a TFT as a switching element is suitable to display a moving image.

Hereinafter, a structure of a general active matrix LCD device will be described in detail with reference to the drawing.

FIG. 1 is a diagram schematically illustrating a structure of a general active matrix LCD device.

With reference to FIG. 1, the active matrix LCD device includes a liquid crystal panel 1 configured with a plurality of switching elements T which are respectively formed at a plurality of areas defined by intersections between a plurality of gate lines GL and a plurality of data lines DL. The liquid crystal panel 1 has a structure in which a digital video signal is converted into an analog signal by using a gamma voltage, the analog signal is supplied to a data line DL, a gate signal is supplied to a gate line GL simultaneously with the supply of the analogy signal, and a data signal is charged into a liquid crystal cell C.

Although not shown in detail, a gate electrode of a switching element C is connected to the gate line GL, a source electrode of the switching element C is connected to the data line DL, and a drain electrode of the switching element C is connected to a pixel electrode of the liquid crystal cell C.

A common voltage Vcom is supplied to a common electrode of the liquid crystal cell C through a common line CL. When the gate signal is applied to the gate line GL, the switching element T is turned on to form a channel between the source electrode and the drain electrode, and supplies a voltage, applied through the data line DL, to the pixel electrode of the liquid crystal cell C. At this time, alignment of liquid crystal molecules of the liquid crystal cell C is changed by an electric field between the pixel electrode and the common electrode, thereby displaying an image based on incident light.

A twisted nematic (TN) mode or an in-plane switching (IPS) mode, which is a driving mode of the LCD device, is determined depending on positions of the common electrode and pixel electrode of the liquid crystal panel 1. In particular, the IPS mode in which the common electrode and the pixel electrode are disposed in parallel on one substrate to generate a lateral electric field has a broader viewing angle than that of the TN mode in which the common electrode and the pixel electrode are disposed on different substrates to be opposite to each other and generate a lateral electric field.

A gate driving unit 2 for driving the plurality of gate lines GL and a data driving unit 3 for driving the plurality of data lines DL are connected to the liquid crystal panel 1 of the LCD device having the above-description configuration. As LCD devices enlarge in size and become higher in resolution, the number of integrated circuits (ICs) configuring each of the gate driving unit 2 and the data driving unit 3 increases.

However, since the IC of the data driving unit 3 is relatively more expensive than other elements, technology for decreasing the number of the ICs of the data driving unit 3 is being recently researched and developed for reducing the manufacturing cost of an LCD device. As an example of the technology, a double rate driving (DRD) structure is being developed in which the number of the gate lines GL increases by two times, the number of the data lines DL is reduced by half (½), the number of the ICs of the data driving unit 3 is reduced by half, and a resolution is maintained identically to the existing resolution.

In the DRD structure, the cost is reduced, but since the number of the gate lines GL increases and thus an operable time of a device is shortened, a design with the consideration of charging efficiency and a charging rate is needed. Also, since a plurality of gate lines GL are further provided in a vertical direction, an aperture ratio is lowered in inverse proportion to an increase in the number of the gate lines.

SUMMARY OF THE DISCLOSURE

Accordingly, the present invention is directed to an array substrate for liquid crystal display (LCD) devices and method of manufacturing the same that substantially obviate one or more of the problems due to limitations and disadvantages of the related art.

An object of the present invention is to provide an array substrate for liquid crystal display (LCD) devices and method of manufacturing the same, in which the cost is reduced by decreasing the number of ICs of a data driving unit without a reduction in an operable time of a device or an aperture ratio.

Additional features and advantages of the invention will be set forth in the description which follows, and in part will be apparent from the description, or may be learned by practice of the invention. The objectives and other advantage of the invention will be realized and attainted by the structure particularly pointed out in the written description and claims hereof as well as the appended drawings.

To achieve these and other advantages and in accordance with the purpose of the present invention, as embodied and broadly described, a method of manufacturing an array substrate for LCD devices includes: forming a gate electrode, a gate line, a common line, and a first connection line on a substrate; forming a gate insulating layer on the substrate in which the gate electrode, the gate line, the common line, and the first connection line are formed; forming an active layer on the gate electrode in which the gate insulating layer is formed; forming a source electrode and a drain electrode on the substrate in which the active layer is formed, and simultaneously forming a data line that intersects the gate line to define a pixel; forming a protective layer on the substrate in which the source electrode, the drain electrode, and the data line are formed; and forming a common electrode, a pixel electrode, and a second connection line on the substrate in which the protective layer is formed, wherein at least two or more adjacent pixels share one data line or two adjacent data lines are disposed adjacent to each other in one pixel, and when a data line area of an empty space in which the data line is not formed is formed, the first connection line and the second connection line are formed in the data line area of the empty space.

In another aspect, an array substrate for LCD devices includes: a gate electrode, a gate line, a common line, and a first connection line formed on a substrate; a gate insulating layer formed on the substrate in which the gate electrode, the gate line, the common line, and the first connection line are formed; an active layer formed on the gate electrode in which the gate insulating layer is formed; a source electrode and a drain electrode formed on the substrate in which the active layer is formed, and a data line that intersects the gate line to define a pixel; a protective layer formed on the substrate in which the source electrode, the drain electrode, and the data line are formed; and a common electrode, a pixel electrode, and a second connection line formed on the substrate in which the protective layer is formed, wherein at least two or more adjacent pixels share one data line or two adjacent data lines are disposed adjacent to each other in one pixel, and when a data line area of an empty space in which the data line is not formed is formed, the first connection line and the second connection line are formed in the data line area of the empty space.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure. In the drawings.

DETAILED DESCRIPTION OF THE ILLUSTRATED EMBODIMENTS

Figure 1:
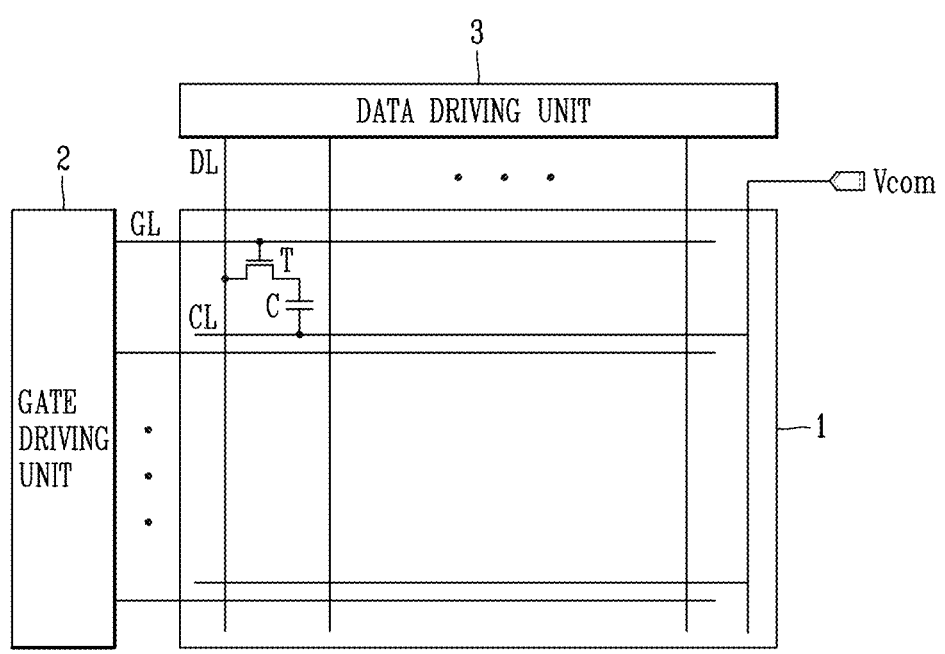
FIG. 1 is a diagram schematically illustrating a structure of a general active matrix LCD device.

Description will now be given in detail of the exemplary embodiments, with reference to the accompanying drawings. For the sake of brief description with reference to the drawings, the same or equivalent components will be provided with the same reference numbers, and description thereof will not be repeated.

Hereinafter, embodiments will be described in detail with reference to the accompanying drawings such that they can be easily practiced by those skilled in the art to which the present invention pertains.

The advantages and features of the present invention and methods for achieving these will be clarified in detail through embodiments described hereinafter in conjunction with the accompanying drawings. However, embodiments of the present invention may, however, be implemented in many different forms and should not be construed as being limited to the embodiments set forth herein. Rather, these embodiments are provided so that this disclosure will be thorough and complete, and will fully convey the scope of the invention to those skilled in the art and are defined by the claim coverage of the present invention. Throughout the specification, the same reference numerals will be used to designate the same or like components. In the drawings, the sizes or shapes of elements may be exaggeratedly illustrated for clarity and convenience of description.

It will be understood that when an element or layer is referred to as being "on" or "connected to" another element or layer, it can be directly on or directly connected to the other element or layer, or intervening elements or layers may be present.

Relative terms, such as "lower" or "bottom" and "upper" or "top," may be used herein to describe relationship of one or more elements to another elements as illustrated in the Figures. It will be understood that relative terms are intended to encompass different orientations of the device in addition to the orientation depicted in the Figures. For example, if a device in the Figures is turned over, elements described as being on the "lower" side of other elements would then be oriented on "upper" sides of the other elements. The exemplary term "lower," can therefore, encompasses both an orientation of "lower" and "upper," depending of the particular orientation of the figure. Similarly, if the device in one of the figures is turned over, elements described as "below" or "beneath" other elements would then be oriented "above" the other elements. The terms "below" or "beneath" can therefore encompass both an orientation of above and below.

The terms used herein are for the purpose of describing particular embodiments only and are not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 2:
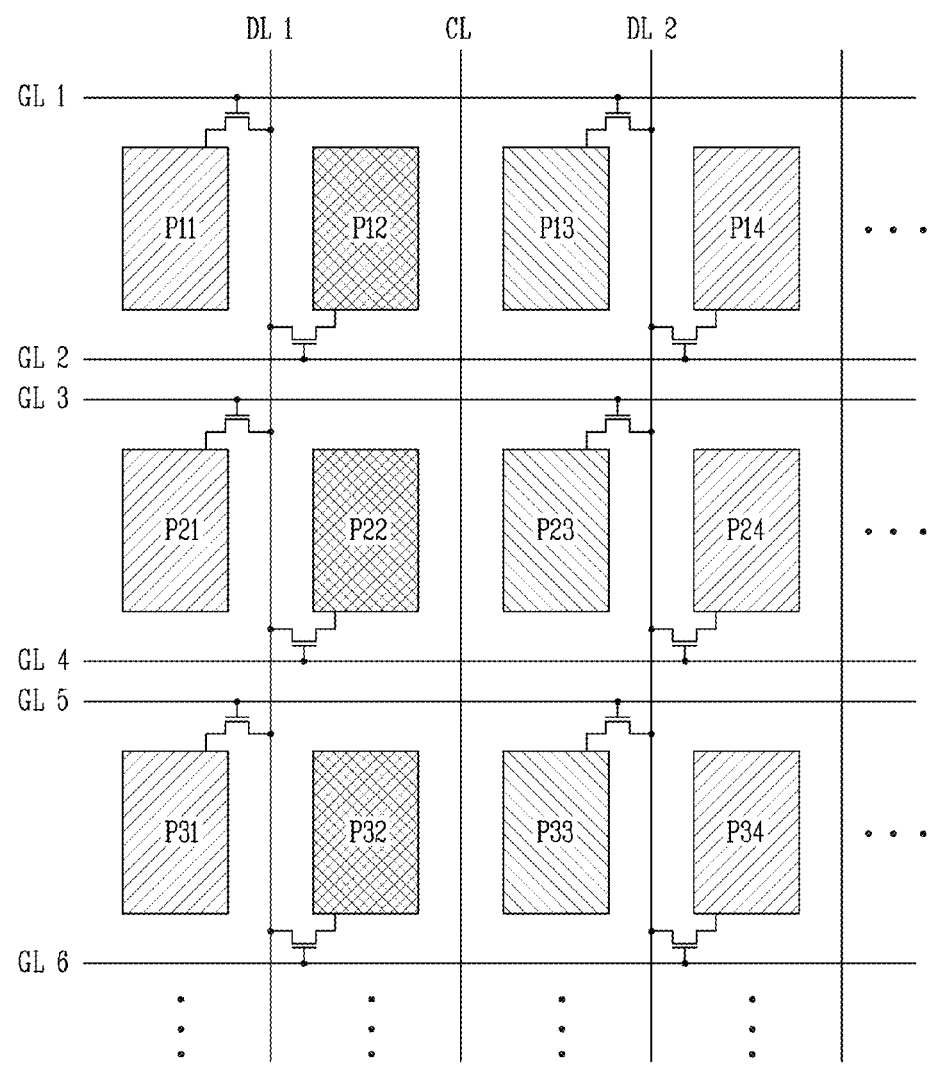
FIG. 2 is a diagram schematically illustrating a pixel structure of an LCD device having a DRD structure according to an example embodiment of the present invention.

FIG. 2 is a diagram schematically illustrating a pixel structure of an LCD device having a DRD structure according to an example embodiment of the present invention.

As illustrated in FIG. 2, for example, in the LCD device having the DRD structure, two pixels P11 and P12 (P13 and P14) disposed on one horizontal line are connected to one data line DL1 (DL2) and two gate lines GL1 and GL2 (GL1 and GL2), and two pixels P21 and P22 (P23 and P24) disposed on a next horizontal line are connected to the one data line DL1 (DL2) and other two gate lines GL3 and GL4 (GL3 and GL4).

For example, in such an array pixel, a red liquid crystal cell to which red data is applied, a green liquid crystal cell to which green data is applied, and a blue liquid crystal cell to which blue data is applied are alternately disposed along a column direction. In the pixel array, each of a plurality of pixels (P11, P12, . . . ) includes the red liquid crystal cell, the green liquid crystal cell, and the blue liquid crystal cell which are adjacent to each other along a row direction crossing the column direction.

In this case, two liquid crystal cells sharing the same data line (DL1, DL2, . . . ) are sequentially connected to two adjacent gate lines (GL1, GL2, GL3, GL4, GL5, GL6, . . . ).

For example, in the LCD device having the DRD structure, when a data signal having the same polarity is applied to one data line (DL1, DL2, . . . ) during one frame so as to minimize flicker and reduce power consumption, column inversion may be implemented.

Figure 3:
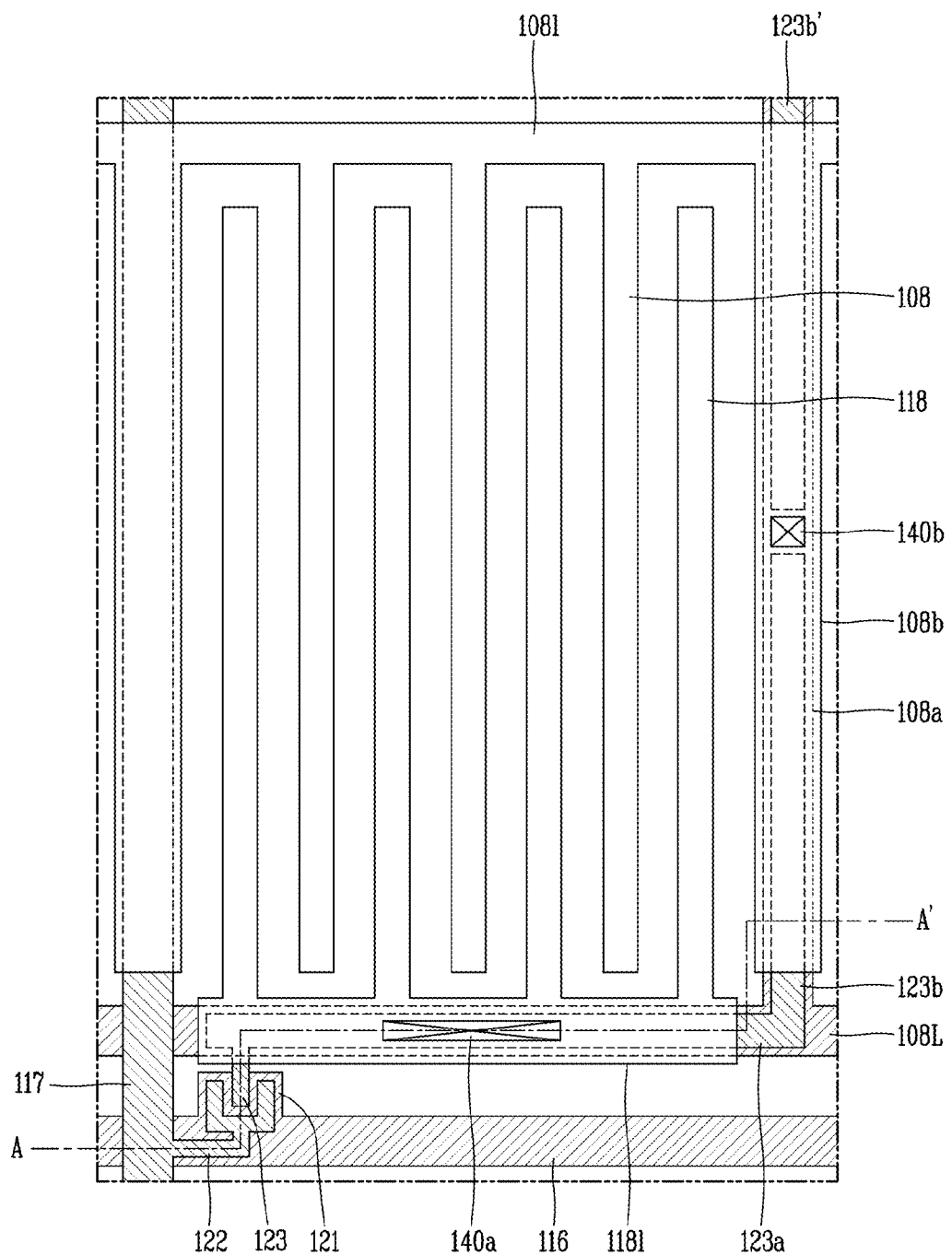
FIG. 3 is a plan view schematically illustrating a portion of an array substrate for LCD devices according to a first example embodiment of the present invention.

FIG. 3 is a plan view schematically illustrating a portion of an array substrate for LCD devices according to a first example embodiment of the present invention.

Figure 4:
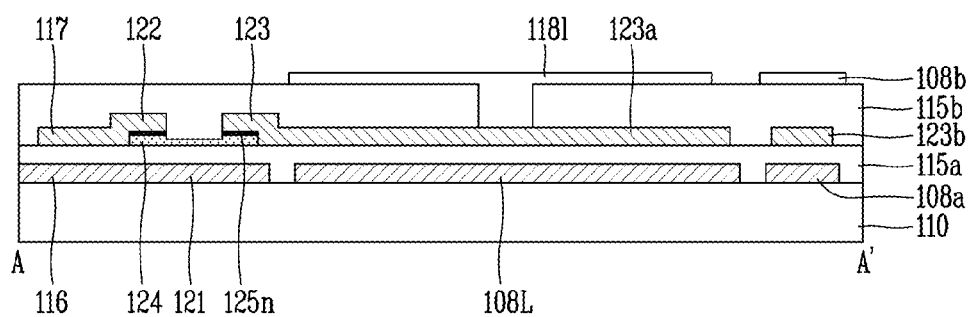
FIG. 4 is a view schematically illustrating a cross-sectional surface taken along line A-A' of the array substrate for LCD devices according to the first example embodiment of the present invention illustrated in FIG. 3.

FIG. 4 is a view schematically illustrating a cross-sectional surface taken along line A-A' of the array substrate for LCD devices according to the first example embodiment of the present invention illustrated in FIG. 3.

In this case, M×N number of pixels defined by intersections between N number of gate lines and M number of data lines are actually formed on the array substrate, but for conciseness of description, one pixel is illustrated in the drawing.

FIG. 3 illustrates, as an example, a portion of an array substrate for IPS-mode LCD devices in which a common electrode and a pixel electrode are disposed in parallel on one substrate to generate a vertical electric field. However, the present invention is not limited to the IPS-mode LCD device. For example, the present invention may be applied to all liquid crystal modes such as a TN mode, a fringe field switching (FFS) mode, and a vertical alignment (VA) mode.

Moreover, the present invention may be implemented in various types such as a transmissive LCD device, a semi-transmissive LCD device, and a reflective LCD device. For reference, the transmissive LCD device and the semi-transmissive LCD device need a backlight unit, which may be implemented in a direct type or an edge type.

As illustrated in the drawings, the array substrate for LCD devices according to the first example embodiment of the present invention includes a plurality of gate lines 116, which extend in one direction and are arranged in parallel on a substrate 10, and a plurality of data lines 117 which are arranged to intersect the plurality of gate lines 116 and define a plurality of pixels.

Each of the plurality of pixels includes a thin film transistor (TFT) which includes a gate electrode 121 connected to a corresponding gate line 116, an active layer 124, a source electrode 122 connected to a corresponding data line 117, and a drain electrode 123 that forms a U-shaped or L-shaped channel.

In this case, the active layer 124 may be formed of an amorphous silicon thin layer, a polycrystalline silicon thin layer, or an oxide semiconductor. For example, when the active layer 124 is formed of the amorphous silicon thin layer, a source area and a drain area of the active layer 124 is electrically connected to the source electrode 122 and the drain electrode 123 through an ohmic contact layer 125n which is formed on the active layer 124.

In each pixel, a transparent common electrode 108 and a transparent pixel electrode 118 are alternately disposed with a space, separated from the gate line 116 and the data line 117, therebetween.

One end of each of a plurality of the common electrodes 108 is connected to a common electrode line 108*l* which is arranged in substantially parallel with the gate line 116. The common electrode line 108*l* is connected to a second connection line 108*b* which is formed in a data line area (i.e., an area in which the data line 117 is formed or an empty space in which the data line 117 is not formed).

The second connection line 108*b*, which is formed in the empty space in which the data line 117 is not formed, is electrically connected to a first connection line 108*a*, which is formed under the second connection line 108*b*, through a second contact hole 140*b* which is formed in a gate insulating layer 115*a* and a protective layer 115*b*. In this case, the first connection line 108*a* is connected to a common line 108L which is arranged in substantially parallel with the gate line 116, and thus, the plurality of common electrodes 108 are supplied with a common voltage through the common line 108L.

One end of each of a plurality of the pixel electrodes 118 is connected to a pixel electrode line 118*l* which is arranged in substantially parallel with the gate line 116, and the pixel electrode line 118*l* is electrically connected to a first storage electrode 123*a*, which extends from the drain electrode 123, through a first contact hole 140*a* which is formed at the protective layer 115*b*. Therefore, each of the plurality of pixel electrodes 118 is supplied with a data signal through the drain electrode 123.

Here, the first storage electrode 123*a* overlaps a portion of the common line 108L on the common line 108L to configure a main storage capacitor.

The first storage electrode 123*a* extends to on the first connection line 108*a* to form a second storage electrode 123*b* (123*b'*). The second storage electrode 123*b* (123*b'*) overlaps a portion of the first connection line 108*a* on the first connection line 108*a* to configure a first sub storage capacitor. Also, the second storage electrode 123*b* (123*b'*) overlaps a portion of the second connection line 108*b* under the second connection line 108*b* to configure a second sub storage capacitor.

In this case, the second storage electrode 123*b* (123*b'*) configures a sub storage capacitor in each of left and right two pixels which are divided upward and downward in one data line area and are adjacent to each other. That is, the second storage electrode 123*b* (123*b'*) is cut at a middle portion, and thus, acts as a storage electrode configuring a sub storage capacitor in left and right two pixels. Here, a cut gap does not occupy a large portion of a whole length, and may have a separated distance except an area occupied by the second contact hole 140b.

As described above, the LCD device according to the first example embodiment of the present invention uses the DRD structure in which the number of the data lines 117 is reduced by half (½), the number of ICs of a data driving unit is reduced by half, and a resolution is maintained identically to the existing resolution. Accordingly, the manufacturing cost of the LCD device is reduced, and moreover, power consumption can be reduced in implementing a column inversion method.

Since the number of the data lines 117 is reduced by half, a data line area of an empty space in which the data line 117 is not formed is formed. In the LCD device according to the first example embodiment of the present invention, the first and second common lines 108a and 108b are formed in the data line area of the empty space, and by applying a common signal to the first and second common lines 108a and 108b, an operable time of a device can be prevented from being shortened.

That is, in the DRD structure, although the number of ICs of the data driving unit is reduced by half and thus the cost is reduced, since the number of the gate lines 116 increases by two times, an operable time of a device is reduced by half, and for this reason, a design with the consideration of charging efficiency and a charging rate is needed. Therefore, in the present invention, the first and second common lines 108a and 108b are formed in the data line area of the empty space, and by applying the common signal to the first and second common lines 108a and 108b, an operable time of a device can be prevented from being shortened.

Moreover, in the LCD device according to the first example embodiment of the present invention, the second storage electrode 123b (123b') is formed between the first common line 108a and the second common line 108b, and thus, the first sub storage capacitor and the second sub storage capacitor are formed along with the second storage electrode 123b (123b'). Accordingly, a storage capacitance can be sufficiently secured.

In this case, since a sufficient storage capacitance is secured, an area of a main storage capacitor can be reduced, and thus, an open area is secured, thereby enhancing an aperture ratio.

As described above, by using the DRD structure, the cost is reduced, but since the number of the gate lines 116 increases by two times, an aperture ratio is lowered in inverse proportion to an increase in the number of the gate lines. In the DRD structure, the gate lines 116 are further provided in a vertical direction, and thus, an aperture ratio is reduced. A storage capacitor is an essential element that holds a charged voltage during one frame and is generally disposed in an open area, and thus affects an aperture ratio. In the present invention, the storage capacitor (i.e., a sub storage capacitor) is formed in a data line area that is a non-open area, and a sub storage capacitor having a double structure is formed, thereby enhancing an aperture ratio.

Hereinafter, a method of manufacturing the array substrate for LCD devices according to the first embodiment of the present invention having the above-described configuration will be described in detail with reference to the drawings.

FIGS. 5A to 5E are plan views sequentially illustrating a process of manufacturing the array substrate for LCD devices according to the first embodiment of the present invention illustrated in FIG. 3.

FIGS. 6A to 6E are cross-sectional views sequentially illustrating the process of manufacturing the array substrate for LCD devices according to the first embodiment of the present invention illustrated in FIG. 4.

Figure 5A:
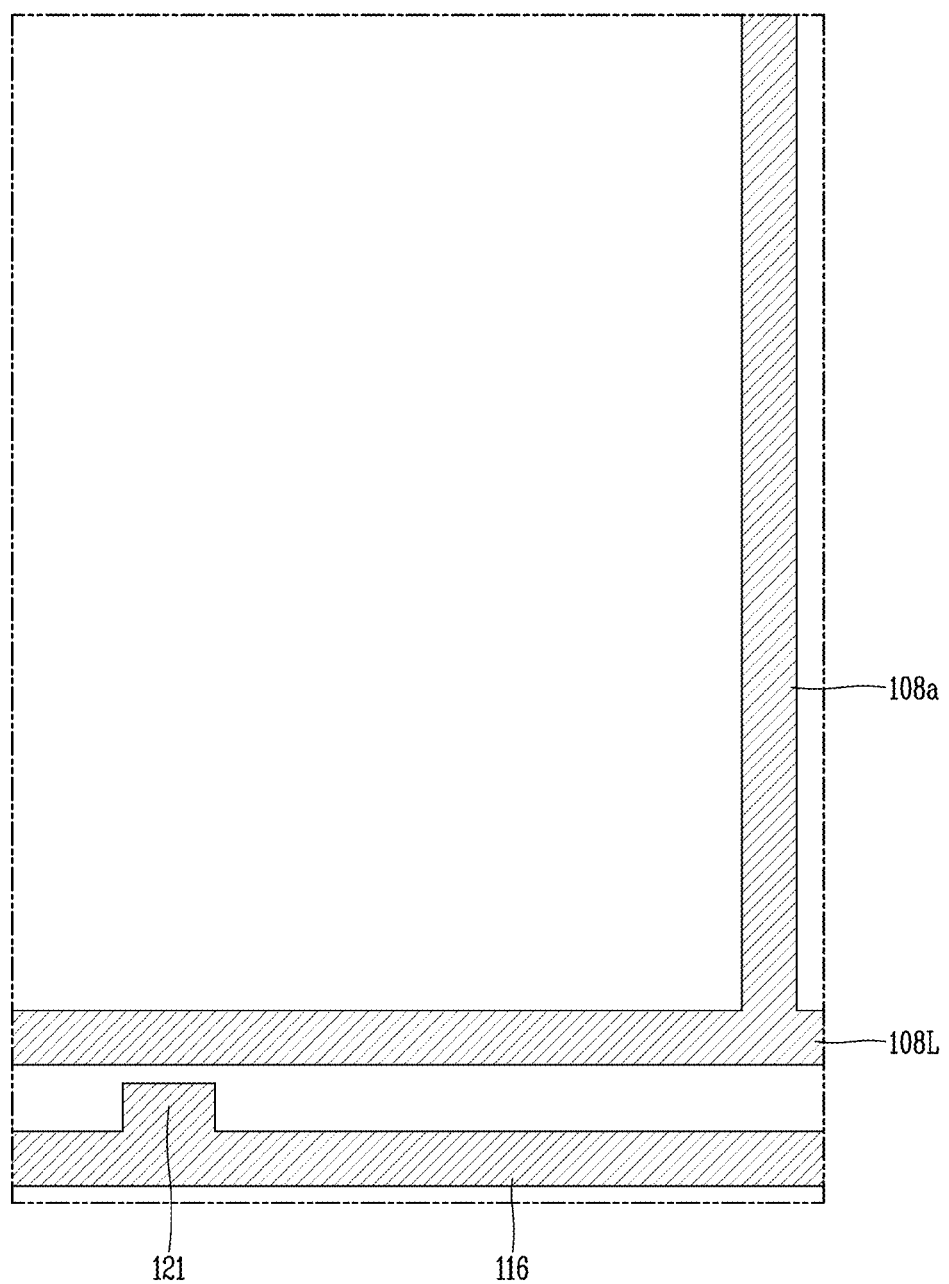
FIGS. 5A to 5E are plan views sequentially illustrating a process of manufacturing the array substrate for LCD devices according to the first example embodiment of the present invention illustrated in FIG. 3.
Figure 6A:
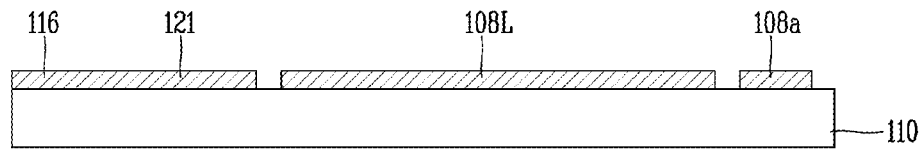
FIGS. 6A to 6E are cross-sectional views sequentially illustrating the process of manufacturing the array substrate for LCD devices according to the first example embodiment of the present invention illustrated in FIG. 4.

As illustrated in FIGS. 5A and 6A, the gate electrode 121, the gate line 116, the common line 108L, and the first connection line 108a are formed on a substrate 110 which is formed of a transparent insulator such as glass.

The gate electrode 121 configures a portion of the gate line 116, and the common line 108L may be formed in a direction which is substantially parallel to the gate line 116.

The first connection line 108a connected to the common line 108L is substantially formed in a direction vertical to the gate line 116, and is formed in a data line area of an empty space which is a non-open area.

Although not shown, the gate line 116 may be disposed by twos in one pixel, for applying the DRD structure.

In this case, a first conductive layer is deposited all over the substrate 110, and then, the gate electrode 121, the gate line 116, the common line 108L, and the first connection line 108a are formed by selectively patterning the first conductive layer through a photolithography process (a first mask process).

Here, the first conductive layer may be formed of a low resistance opaque conductive material such as aluminum (Al), Al alloy, tungsten (W), copper (Cu), chromium (Cr), molybdenum (Mo), and Mo alloy. Also, the first conductive layer may be formed in a multi-layer structure where two or more kinds of low resistance opaque conductive materials are stacked.

Figure 5B:
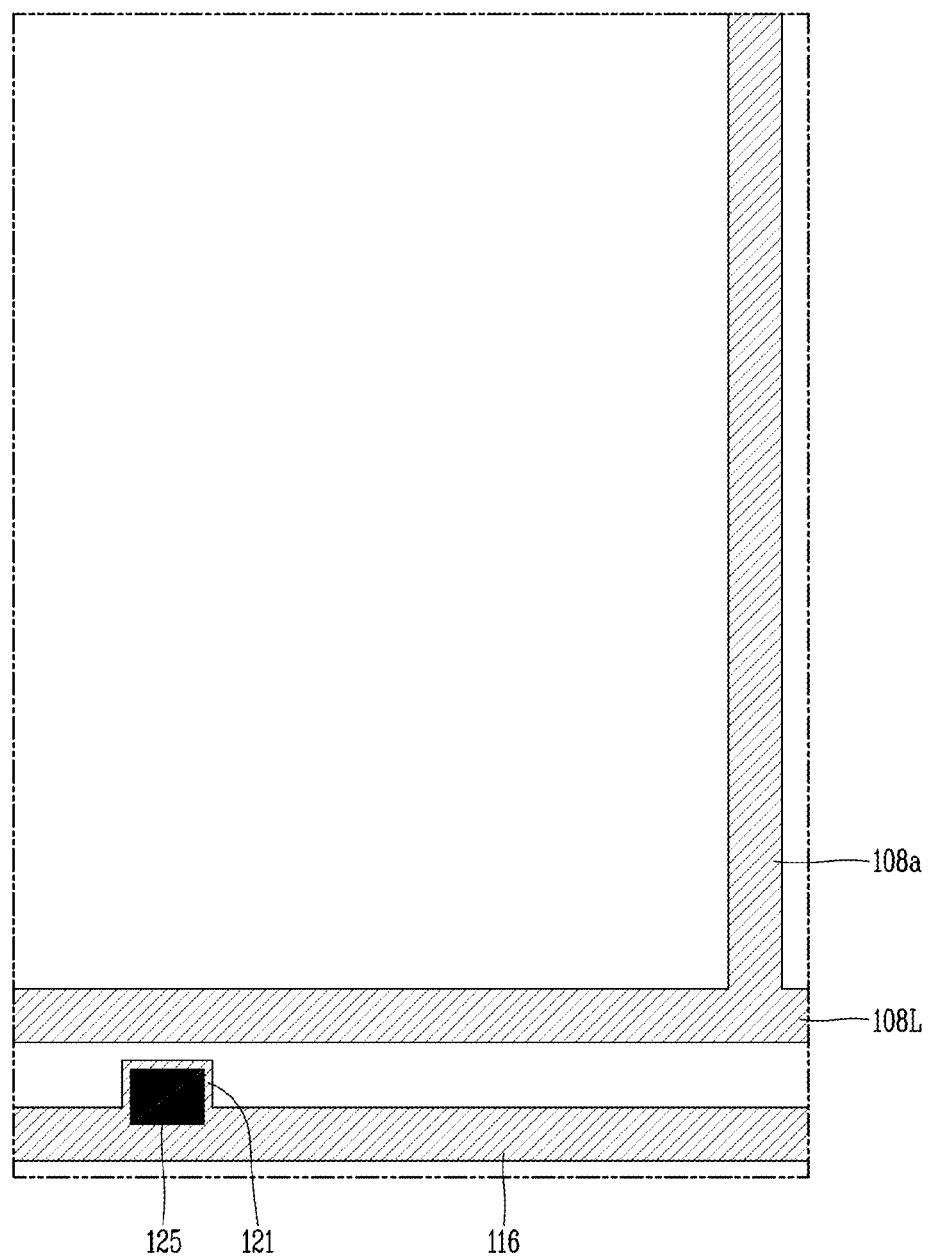
Figure 6B:
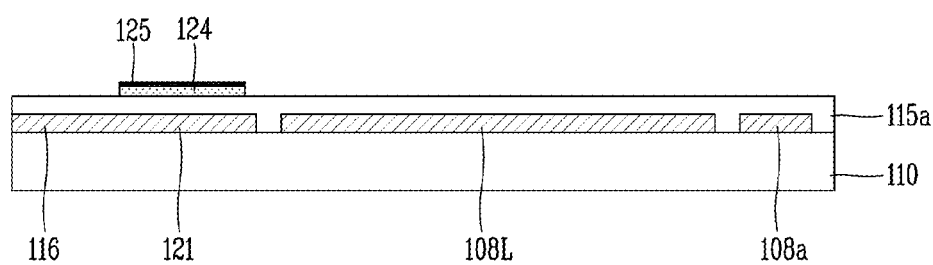

Subsequently, as illustrated in FIGS. 5B and 6B, the gate insulating layer 115a, an amorphous silicon thin layer, and an n+ amorphous silicon thin layer are formed all over the substrate 100 on which the gate electrode 121, the gate line 116, the common line 108L, and the first connection line 108a are formed.

Subsequently, by selectively removing the amorphous silicon thin layer and the n+ amorphous silicon thin layer through a photolithography process (a second mask process), the active layer 124 formed of the amorphous silicon thin layer is formed on the gate electrode 121 of the substrate 110.

At this time, the n+ amorphous silicon thin layer is formed on the active layer 124, and an n+ amorphous silicon thin layer pattern 125 which is patterned in the substantially same pattern as that of the active layer 124 is formed.

Figure 5C:
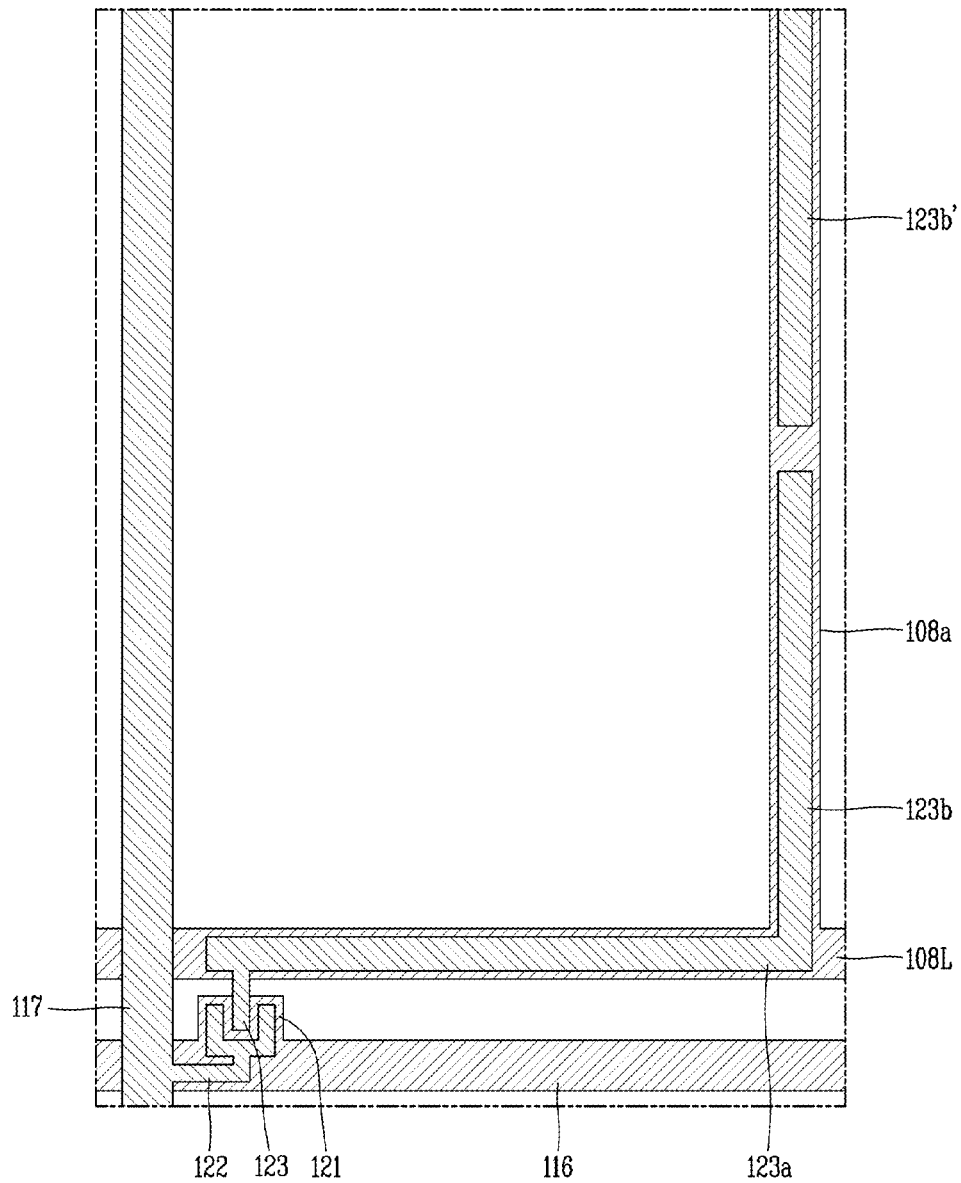
Figure 6C:
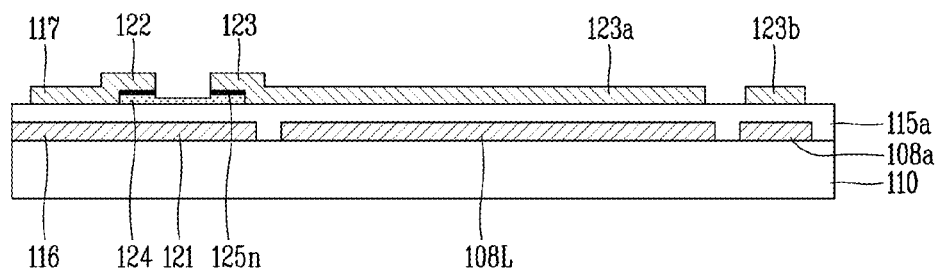

Subsequently, as illustrated in FIGS. 5C and 6C, a second conductive layer is formed all over the substrate 100 on which the active layer 124 and the n+ amorphous silicon thin layer pattern 125 are formed.

In this case, the second conductive layer may be formed of a low resistance opaque conductive material such as aluminum (Al), Al alloy, tungsten (W), copper (Cu), chromium (Cr), molybdenum (Mo), and Mo alloy, for forming a source electrode, a drain electrode, and a data line. Also, the second conductive layer may be formed in a multi-layer structure where two or more kinds of low resistance opaque conductive materials are stacked.

Subsequently, by selectively removing the n+ amorphous silicon thin layer and the second conductive layer through a photolithography process (a third mask process), the source electrode 122 and the drain electrode 123 which are formed of the second conductive layer are formed on the active layer 124.

Moreover, the data line 117 which defines a pixel along with the gate line 116 is formed in the data line area of the substrate 110 through the third mask process. The data line 117 may be disposed by twos in one pixel, for applying the DRD structure. In this case, as described above, the firs connection line 108a may be disposed in a data line area of an empty space.

In this case, the n+ amorphous silicon thin layer is formed on the active layer 124, and the ohmic contact layer 125n that respectively ohmic-contacts the source area and the drain area with the source electrode 122 and the drain electrode 123 of the active layer 124 is formed.

Moreover, a portion of the source electrode 122 extends in one direction, and is connected to the data line 117.

A portion of the drain electrode 123 extends along the common line 108L on the common line 108L to configure the first storage electrode 123a. A portion of the first storage electrode 123a extends along the first connection line 108a on the first connection line 108a to form the second storage electrode 123b (123b').

In this case, the first storage electrode 123a overlaps a portion of the common line 108L on the common line 108L to configure the main storage capacitor. The second storage electrode 123b (123b') overlaps a portion of the first connection line 108a on the first connection line 108a to configure the first sub storage capacitor.

In the first example embodiment of the present invention, a case in which the active layer 124, the ohmic contact layer 125n, and the data line (i.e., the source electrode 122, the drain electrode 123, and the data line 117) are formed through a two-time mask process is described as an example, but the present embodiment is not limited thereto. For example, the active layer 124, the ohmic contact layer 125n, and the data line may be formed by a one-time mask process by using a half tone mask or a diffraction mask.

Figure 5D:
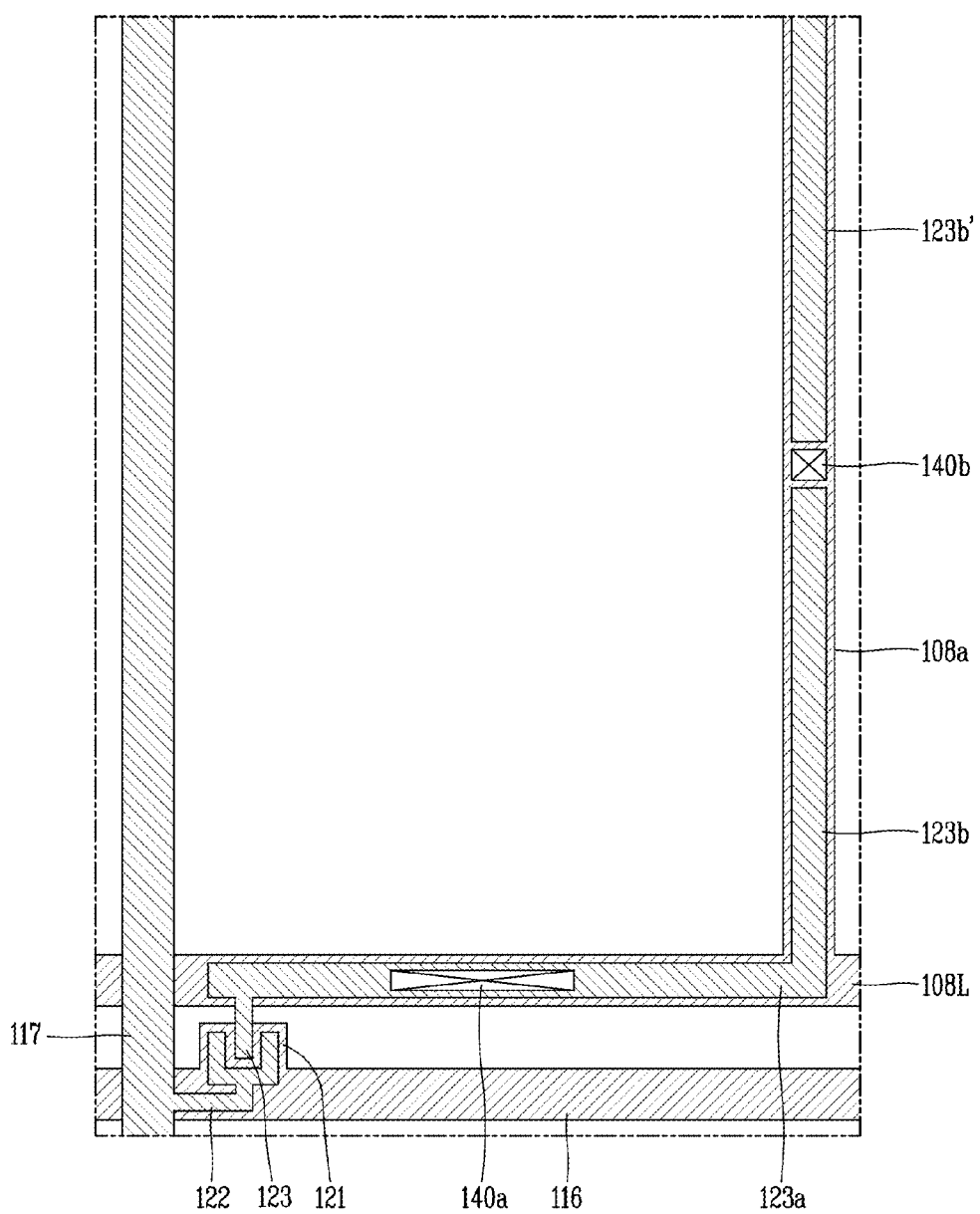
Figure 6D:
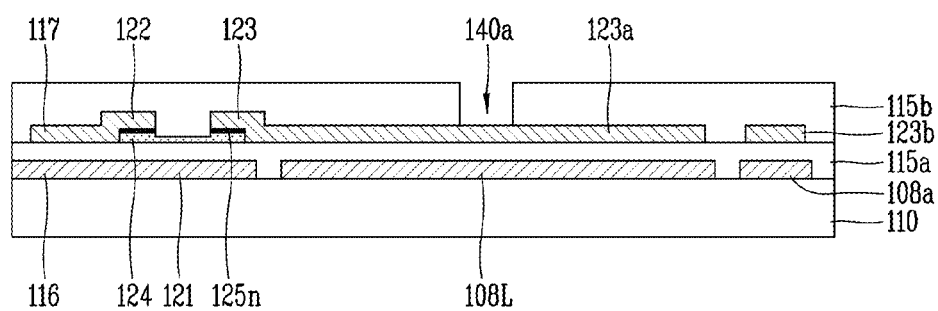

Subsequently, as illustrated in FIGS. 5D and 6D, the protective layer 115b is formed all over the substrate 110 on which the active layer 124, the source electrode 122, the drain electrode 123, and the data line 117 are formed.

In this case, the protective layer 115b may be formed of an inorganic insulating layer, such as SiNx or $SiO_2$, or an organic insulating layer such as photo acryl.

Subsequently, the first contact hole 140a which exposes a portion of the first storage electrode 123a is formed by selectively removing the protective layer 115b through a photolithography process (a fourth mask process), and the second contact hole 140b which exposes a portion of the first connection line 108a is formed by selectively removing the gate insulating layer 115a and the protective layer 115b. In this case, the present invention is not limited to positions at which the first contact hole 140a and the second contact hole 140b are formed.

Figure 5E:
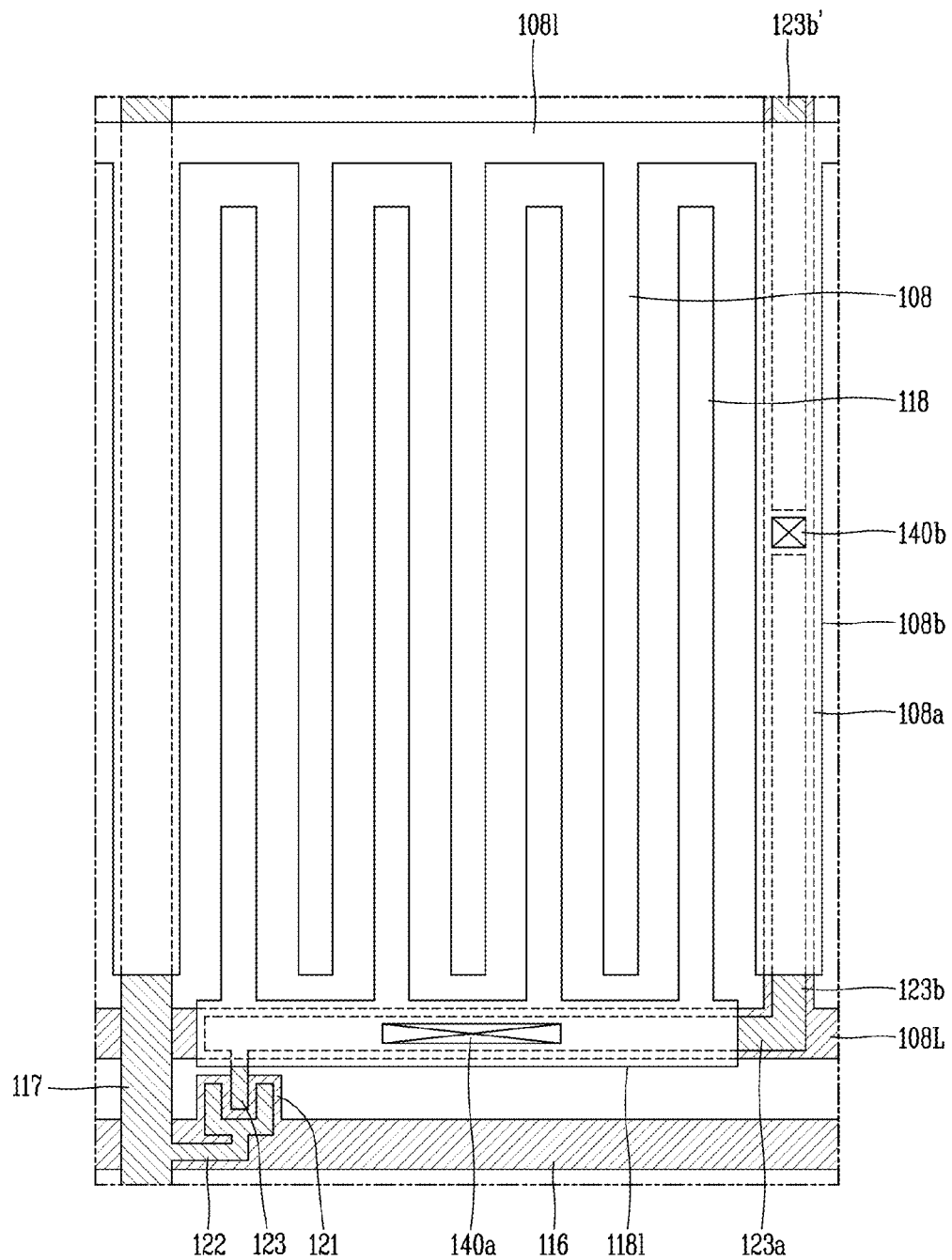
Figure 6E:
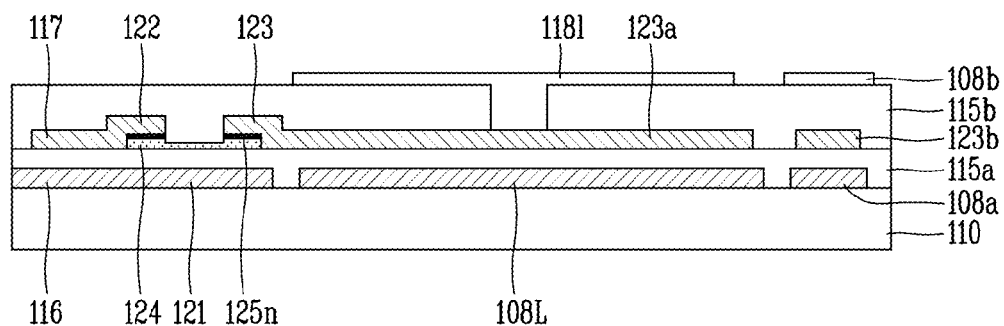

Subsequently, as illustrated in FIGS. 5E and 6E, a third conductive layer is formed all over the substrate 110.

The third conductive layer may be formed of a transparent conductive material, having a good transmittance, such as indium tin oxide (ITO) or indium zinc oxide (IZO), for forming a common electrode and a pixel electrode.

Subsequently, the plurality of common electrodes 108 and the plurality of pixel electrodes 118 which are formed of the third conductive layer in the pixel and are alternately disposed to generate a lateral electric field are formed by selectively removing the third conductive layer through a photolithography process (a fifth mask process).

One end of each of the plurality of common electrodes 108 is connected to the common electrode line 108l which is arranged in substantially parallel with the gate line 116, and the common electrode line 108l is connected to the second connection line 108b which is formed in the data line area (i.e., an area in which the data line 117 is formed or an empty space in which the data line 117 is not formed).

The second connection line 108b, which is formed in the empty space in which the data line 117 is not formed, is electrically connected to the first connection line 108a, which is formed under the second connection line 108b, through the second contact hole 140b which is formed in the gate insulating layer 115a and the protective layer 115b. Therefore, the plurality of common electrodes 108 are supplied with a common voltage through the common line 108L.

The second storage electrode 123b (123b') overlaps a portion of the second connection line 108b under the second connection line 108b to configure the second sub storage capacitor.

As described above, the second storage electrode 123b (123b') configures a sub storage capacitor in each of left and right two pixels which are divided upward and downward in one data line area and are adjacent to each other. That is, a the second storage electrode 123b (123b') is cut at a middle portion, and thus acts as a storage electrode configuring a sub storage capacitor in left and right two pixels. Here, a cut gap does not occupy a large portion of a whole length, and may have a separated distance except an area occupied by the second contact hole 140b.

Subsequently, although not shown, the array substrate having the above-described configuration is facing-coupled to a color filter substrate by a sealant, which is formed at an outer portion of an image display area, in a state where a certain cell gap is maintained by a column spacer. In this case, a black matrix which prevents light from being leaked to the TFT, the gate line, and the data line, a color filter that realizes red, green, and blue colors, and an overcoat layer are formed on the color filter substrate.

In a configuration of the sub storage capacitor according to the present embodiment, a lower first connection line 108a and an upper second connection line 108b may be formed in an open structure instead of a closed structure, and may be implemented in various types under a condition in which a structure enables a storage capacitor to be formed.

FIGS. 7A to 7D are cross-sectional views illustrating configurations of various sub storage capacitors as an example.

Figure 7A:
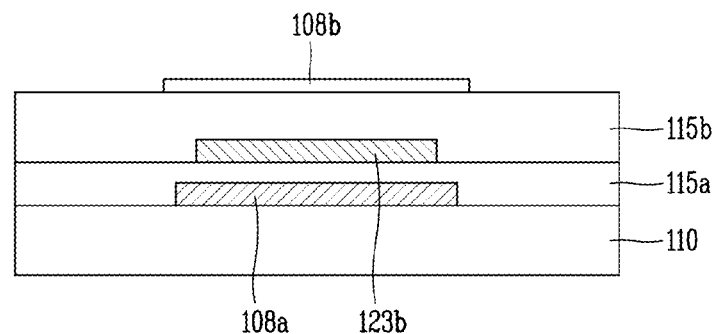
FIGS. 7A to 7D are cross-sectional views illustrating configurations of various sub storage capacitors as an example.

FIG. 7A illustrates a configuration of the above-described sub storage capacitor according to the first example embodiment of the present invention. As illustrated, a first connection line 108a and a second connection line 108b are all formed in a closed structure.

Figure 7B:
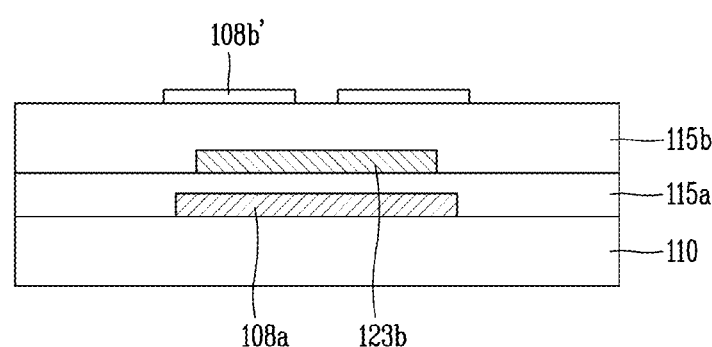
Figure 7C:
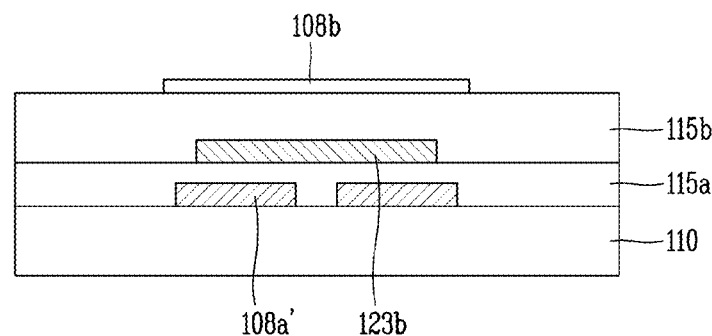

On the other hand, FIG. 7B illustrates a case in which an upper second connection line 108b' is formed in an open structure, and FIG. 7C illustrates a case in which a lower first connection line 108a' is formed in an open structure.

Figure 7D:
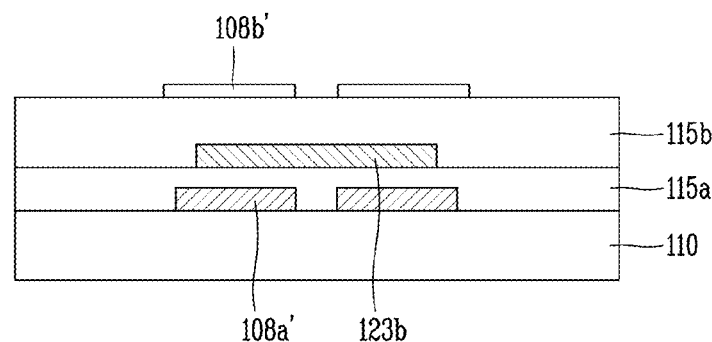

Moreover, FIG. 7D illustrates a case in which the lower first connection line 108a' and the upper second connection line 108b' are all formed in an open structure.

A second connection line according to the present embodiment may be connected to a second connection line of an upper pixel and a second connection line of a lower pixel, and thus may wholly have a grid type. This will be described through a second example embodiment of the present invention.

Figure 8:
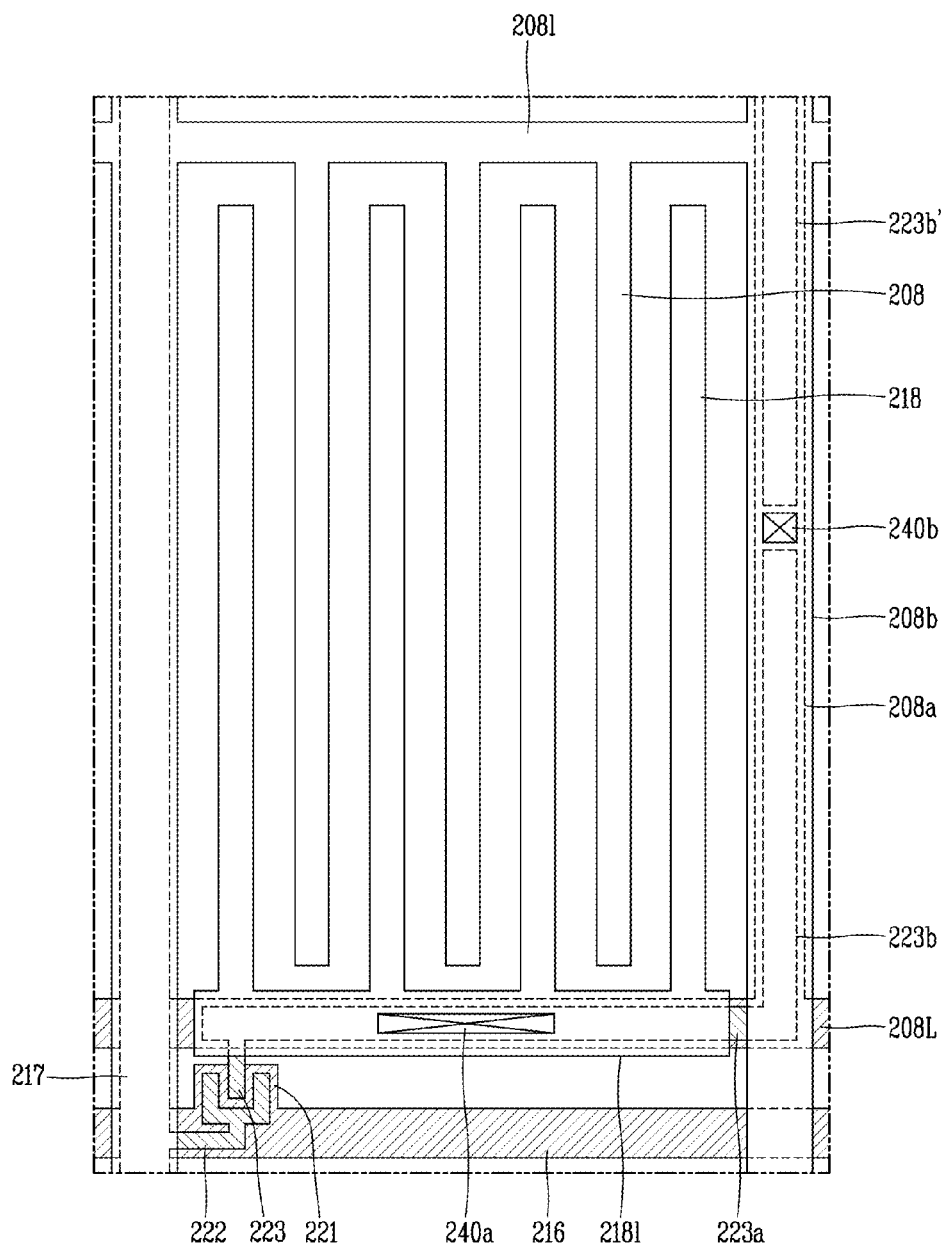
FIG. 8 is a plan view schematically illustrating a portion of an array substrate for LCD devices according to a second example embodiment of the present invention.

FIG. 8 is a plan view schematically illustrating a portion of an array substrate for LCD devices according to a second example embodiment of the present invention.

M×N number of pixels defined by intersections between N number of gate lines and M number of data lines are actually formed on the array substrate, but for conciseness of description, one pixel is illustrated in the drawing.

FIG. 8 illustrates, as an example, a portion of an array substrate for IPS-mode LCD devices in which a common electrode and a pixel electrode are disposed in parallel on one substrate to generate a vertical electric field. However, the present invention is not limited to the IPS-mode LCD device. For example, the present invention may be applied to all liquid crystal modes such as a TN mode, an FFS mode, and a VA mode.

Moreover, the present invention may be implemented in various types such as a transmissive LCD device, a semi-transmissive LCD device, and a reflective LCD device.

As illustrated in the drawings, the array substrate for LCD devices according to the second example embodiment of the present invention includes a plurality of gate lines 216, which extend in one direction and are arranged in parallel on a substrate, and a plurality of data lines 217 which are arranged to intersect the plurality of gate lines 116 and define a plurality of pixels.

Each of the plurality of pixels includes a thin film transistor (TFT) which includes a gate electrode 221 connected to a corresponding gate line 216, an active layer 224, a source electrode 222 connected to a corresponding data line 217, and a drain electrode 223 that forms a U-shaped or L-shaped channel.

In this case, the active layer 224 may be formed of an amorphous silicon thin layer, a polycrystalline silicon thin layer, or an oxide semiconductor.

In each pixel, a transparent common electrode 208 and a transparent pixel electrode 218 are alternately disposed with a space, separated from the gate line 216 and the data line 217, therebetween.

One end of each of a plurality of the common electrodes 208 is connected to a common electrode line 208*l* which is arranged in substantially parallel with the gate line 216. The common electrode line 208*l* is connected to a second connection line 208*b* which is formed in a data line area (i.e., an area in which the data line 217 is formed or an empty space in which the data line 217 is not formed).

The second connection line 208*b*, which is formed in the empty space in which the data line 217 is not formed, is electrically connected to a first connection line 208*a*, which is formed under the second connection line 208*b*, through a second contact hole 240*b* which is formed in a gate insulating layer 215*a* and a protective layer 215*b*. In this case, the first connection line 208*a* is connected to a common line 208L which is arranged in substantially parallel with the gate line 216, and thus, the plurality of common electrodes 208 are supplied with a common voltage through the common line 208L.

The second connection line 208*b* according to the second embodiment of the present invention may be connected to a second connection line 208*b* of an upper pixel and a second connection line 208*b* of a lower pixel, and thus may wholly have a grid type.

One end of each of a plurality of the pixel electrodes 218 is connected to a pixel electrode line 218*l* which is arranged in substantially parallel with the gate line 216, and the pixel electrode line 218*l* is electrically connected to a first storage electrode 223*a*, which extends from the drain electrode 223, through a first contact hole 240*a* which is formed at the protective layer 215*b*. Therefore, each of the plurality of pixel electrodes 218 is supplied with a data signal through the drain electrode 223.

Here, the first storage electrode 223*a* overlaps a portion of the common line 208L on the common line 208L to configure a main storage capacitor.

The first storage electrode 223*a* extends to on the first connection line 208*a* to form a second storage electrode 223*b* (223*b*'). The second storage electrode 223*b* (223*b*') overlaps a portion of the first connection line 208*a* on the first connection line 208*a* to configure a first sub storage capacitor. Also, the second storage electrode 223*b* (223*b*') overlaps a portion of the second connection line 208*b* under the second connection line 208*b* to configure a second sub storage capacitor.

In this case, as described above, the second storage electrode 223*b* (223*b*') configures a sub storage capacitor in each of left and right two pixels which are divided upward and downward in one data line area and are adjacent to each other. That is, a the second storage electrode 223*b* (223*b*') is cut at a middle portion, and thus acts as a storage electrode configuring a sub storage capacitor in left and right two pixels. Here, a cut gap does not occupy a large portion of a whole length, and may have a separated distance except an area occupied by the second contact hole 240*b*.

Similarly to the above-described first example embodiment of the present invention, the LCD device according to the second example embodiment of the present invention uses the DRD structure in which the number of the data lines 217 is reduced by half, the number of ICs of a data driving unit is reduced by half, and a resolution is maintained identically to the existing resolution. Accordingly, the manufacturing cost of the LCD device is reduced, and moreover, power consumption can be reduced in implementing a column inversion method.

Since the number of the data lines 217 is reduced by half, a data line area of an empty space in which the data line 217 is not formed is formed. In the LCD device according to the first example embodiment of the present invention, the first and second common lines 208*a* and 208*b* are formed in the data line area of the empty space, and by applying a common signal to the first and second common lines 208*a* and 208*b*, an operable time of a device can be prevented from being shortened.

Particularly, in the second example embodiment of the present invention, the second connection line 208*b* of the upper pixel is connected to the second connection line 208*b* of the lower pixel, and thus, a common signal can be more effectively applied. Accordingly, a problem in which an operable time of a device can be solved.

Moreover, in the LCD device according to the second example embodiment of the present invention, the second storage electrode 223*b* (223*b*') is formed between the first common line 208*a* and the second common line 208*b*, and thus, the first sub storage capacitor and the second sub storage capacitor are formed along with the second storage electrode 223*b* (223*b*'). Accordingly, a storage capacitance can be sufficiently secured.

In this case, since a sufficient storage capacitance is secured, an area of a main storage capacitor can be reduced, and thus, an open area is secured, thereby enhancing an aperture ratio.

The present invention may be applied to a triple rate driving (TRD) structure in which the number of data lines is reduced by one-third compared to the above-described DRD structure. This will now be described in detail with reference to the drawing.

Figure 9:
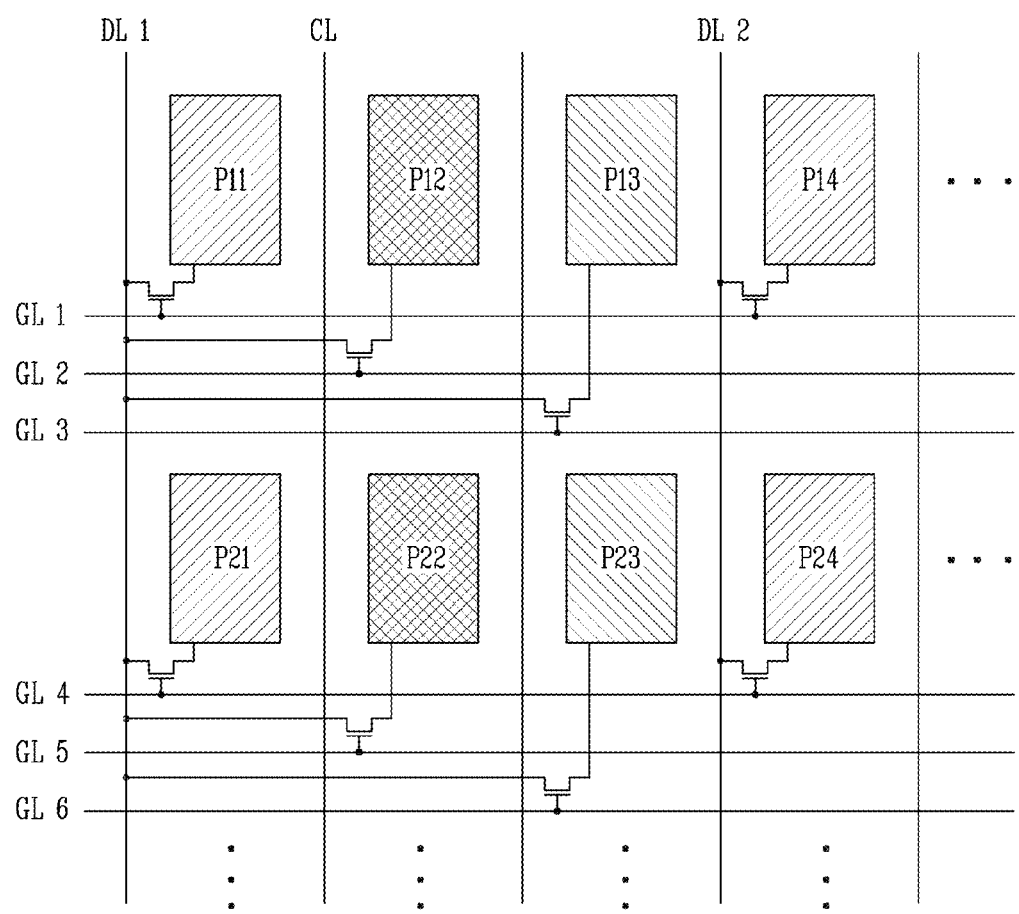
FIG. 9 is a diagram schematically illustrating a pixel structure of an LCD device having a TRD structure according to an example embodiment of the present invention.

FIG. 9 is a diagram schematically illustrating a pixel structure of an LCD device having a TRD structure according to an example embodiment of the present invention.

Except that the number of data lines is reduced by one-third and the number of gate lines increases by three times, the LCD device illustrated in FIG. 9 has the substantially same configuration as that of the above-described LCD device having the DRD structure.

As illustrated, for example, in the LCD device having the TRD structure, three pixels P11, P12 and P13 disposed on one horizontal line are connected to one data line DL1 and three gate lines GL1, GL2 and GL3, and three pixels P21, P22 and P23 disposed on a next horizontal line are connected to the one data line DL1 and other three gate lines GL4, GL5 and GL6.

For example, in such an array pixel, a red liquid crystal cell to which red data is applied, a green liquid crystal cell to which green data is applied, and a blue liquid crystal cell to which blue data is applied are alternately disposed along a column direction. In the pixel array, each of a plurality of pixels (P11, P12, . . . ) includes the red liquid crystal cell, the green liquid crystal cell, and the blue liquid crystal cell which are adjacent to each other along a row direction crossing the column direction.

In this case, three liquid crystal cells sharing the same data line (DL1, DL2, . . . ) are sequentially connected to three adjacent gate lines (GL1, GL2, GL3, GL4, GL5, GL6, . . . ).

In the LCD device having the TRD structure according to the present embodiment, since the number of the data lines (DL1, DL2, . . . ) is reduced by one-third, a data line area of an empty space in which the data line (DL1, DL2, . . . ) is not formed is formed. In this case, similarly to the above-described LCD device having the DRD, the LCD device having the TRD structure according to the present embodiment applies a common signal to the first and second common lines 108a and 108b, thereby preventing an operable time of a device from being shortened.

Moreover, in the LCD device having the TRD structure according to the present embodiment, a second storage electrode is formed between the first common line and the second common line, and thus, a first sub storage capacitor and a second sub storage capacitor are formed along with the second storage electrode. Accordingly, a storage capacitance can be sufficiently secured.

The present invention may be effectively applied to the DRD structure or the TRD structure in which an area for forming a sub storage capacitor is secured. However, even in a normal structure instead of the DRD structure or the TRD structure, when an area for forming a sub storage capacitor is secured because at least one or more data lines are not formed, the present invention may be applied to the normal structure.

Figure 10:
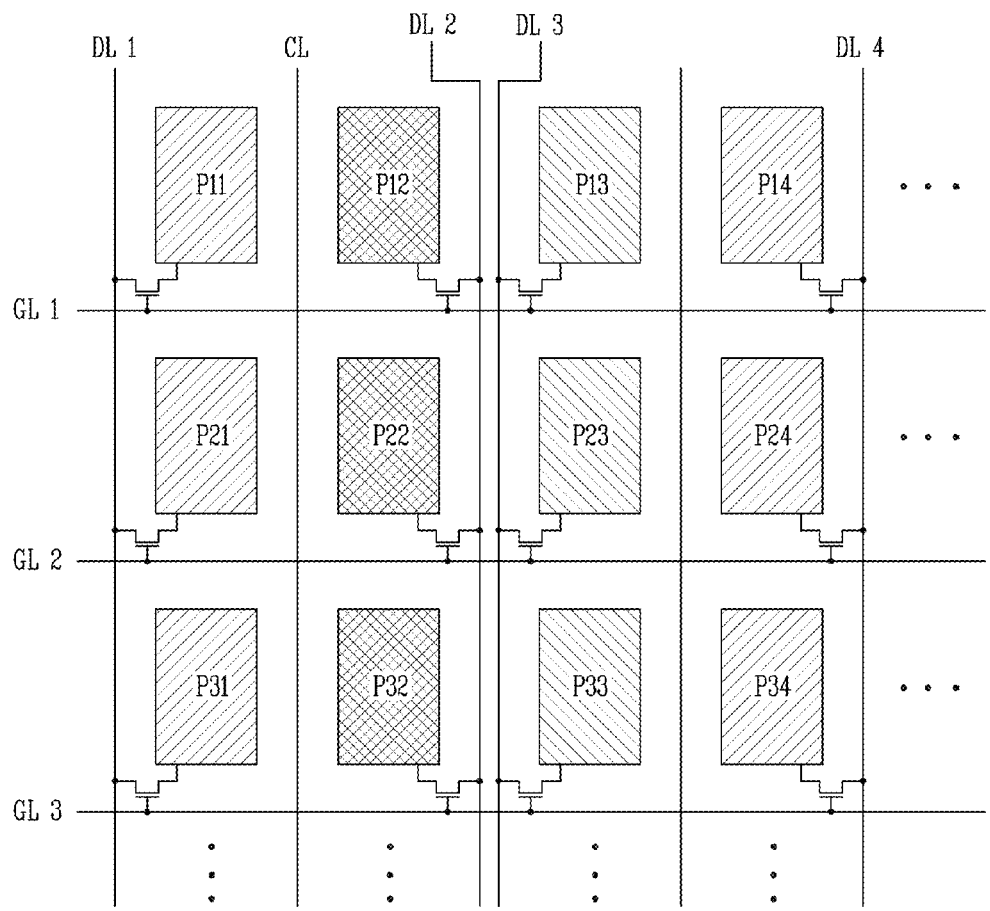
FIG. 10 is a diagram schematically illustrating a pixel structure of an LCD device having a normal structure according to an example embodiment of the present invention.

FIG. 10 is a diagram schematically illustrating a pixel structure of an LCD device having a normal structure according to an example embodiment of the present invention.

Except for the number of data lines and the number of gate lines, the LCD device illustrated in FIG. 10 has the substantially same configuration as those of the above-described LCD device having the DRD structure and the above-described LCD device having the TRD structure.

As illustrated, for example, in the LCD device having a normal structure, one pixel P11 (P12, P13, or P14) disposed on one horizontal line is connected to one data line DL1 (DL2, DL3, or DL4) and one gate line GL1, and one pixel P21 (P22, P23, or P24) disposed on a next horizontal line is connected to the one data line DL1 (DL2, DL3, or DL4) and other one gate line GL2.

For example, in such an array pixel, a red liquid crystal cell to which red data is applied, a green liquid crystal cell to which green data is applied, and a blue liquid crystal cell to which blue data is applied are alternately disposed along a column direction. In the pixel array, each of a plurality of pixels (P11, P12, . . . ) includes the red liquid crystal cell, the green liquid crystal cell, and the blue liquid crystal cell which are adjacent to each other along a row direction crossing the column direction.

In this case, some data lines (DL2, DL3, . . . ) are disposed adjacent to each other, and thus, a data line area of an empty space in which the some data lines (DL2, DL3, . . . ) are not formed is formed. Similarly to the above-described LCD device having the DRD structure and the above-described LCD device having the TRD structure, first and second common lines CL are formed in the data line area.

In the LCD device according to the embodiments of the present invention, an amorphous silicon TFT using an amorphous silicon thin layer as an active layer is described as an example, but the present invention is not limited thereto. The present invention may be applied to a polycrystalline silicon TFT and an oxide TFT which use a polycrystalline silicon thin layer and an oxide semiconductor as the active layer.

Moreover, the present invention may be applied to other display devices (for example, organic light emitting display devices in which an organic light emitting diode (OLED) is connected to a driving transistor) using a TFT, in addition to LCD devices.

As described above, in the array substrate for LCD devices and the method of manufacturing the same according to the embodiments of the present invention, by using a structure where an empty space is secured in a data line area as in the DRD structure in which the number of data lines is reduced by half, a capacitance is sufficiently secured by forming a sub storage capacitor in the data line area of the empty space, and thus, an area of a main storage capacitor can be reduced. Accordingly, the cost can be reduced, and moreover, an aperture ratio can be enhanced.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A method of manufacturing an array substrate for liquid crystal display (LCD) devices, the method comprising:
    forming a gate electrode, a gate line, a common line, and a first connection line on a substrate;

forming a gate insulating layer on the substrate in which the gate electrode, the gate line, the common line, and the first connection line are formed;

forming an active layer on the gate electrode in which the gate insulating layer is formed;

forming a source electrode and a drain electrode on the substrate in which the active layer is formed, and simultaneously forming a data line that intersects the gate line to define a pixel;

forming a protective layer on the substrate in which the source electrode, the drain electrode, and the data line are formed; and forming a common electrode, a pixel electrode, and a second connection line on the substrate in which the protective layer is formed, wherein at least two or more adjacent pixels share one data line or two adjacent data lines are disposed adjacent to each other in one pixel, and when a data line area of an empty space in which the data line is not formed is formed, the first connection line and the second connection line are formed in the data line area of the empty space.

2. The method of claim 1, wherein the common line is formed in a direction parallel to the gate line.

3. The method of claim 1, wherein the first connection line connected to the common line is formed in a direction vertical to the gate line, and is formed in the data line area of the empty space which is a non-open area.

4. The method of claim 1, wherein a portion of the drain electrode extends along the common line on the common line to form a first storage electrode.

5. The method of claim 4, wherein a portion of the first storage electrode extends along the first connection line on the first connection line to form a second storage electrode.

6. The method of claim 4, wherein the first storage electrode overlaps a portion of the common line on the common line to form a main storage capacitor.

7. The method of claim 5, wherein the second storage electrode configures a sub storage capacitor in each of left and right two pixels which are divided upward and downward in one data line area and are adjacent to each other.

8. The method of claim 1, wherein,
one end of each of a plurality of the common electrodes is connected to a common electrode line which is arranged in parallel with the gate line, and
the common electrode line is connected to the second connection line which is formed in a data line area (i.e., an area in which the data line is formed or an empty space in which the data line is not formed).

9. The method of claim 1, wherein one end of each of a plurality of the pixel electrodes is connected to a pixel electrode line which is arranged in parallel with the gate line.

* * * * *